United States Patent [19]
Hutson

[11] 3,974,797
[45] Aug. 17, 1976

[54] APPARATUS FOR APPLYING A FILM OF MATERIAL TO SUBSTRATES OR SLICES

[76] Inventor: Jearld L. Hutson, 2019 W. Valley View Lane, Dallas, Tex. 75234

[22] Filed: July 8, 1974

[21] Appl. No.: 486,449

[52] U.S. Cl. ................................. 118/54; 118/320; 118/416; 118/500; 134/140; 134/25 A
[51] Int. Cl.² ..................... B05C 13/02; B05C 5/00; B05C 3/02
[58] Field of Search ................. 118/52, 54, 56, 500, 118/501, 416, 320; 117/101; 134/140, 153, 157

[56] References Cited
UNITED STATES PATENTS

| | | | |
|---|---|---|---|
| 713,621 | 11/1902 | Ellis et al. | 118/54 |
| 2,082,004 | 6/1937 | Hull | 134/140 |
| 2,218,165 | 10/1940 | Gaebel | 118/52 X |
| 2,614,316 | 10/1952 | Daily et al. | 178/500 X |
| 3,734,337 | 5/1973 | Garrison | 118/52 X |

*Primary Examiner*—John P. McIntosh
*Attorney, Agent, or Firm*—Richards, Harris and Medlock

[57] ABSTRACT

In a method and apparatus for applying light sensitive materials to semiconductor slices, a plurality of semiconductor slices are supported in a spaced apart array extending along an axis. The slices are supported on knife edges positioned at circumferentially spaced points about the axis and each extending angularly both with respect to the axis and with respect to the radii of the slices so that the slices are supported by means of point contact with their edge portions. In one embodiment the knife edge comprise combs mounted in a cylindrical support fixture formed from an open material and including hingedly interconnected half cylinders. In another embodiment the knife edges are supported in a cup-shaped support fixture formed from an open material and adapted to receive semiconductor slices of varying sizes and particularly broken semiconductor slices.

Light sensitive material is simultaneously applied to all of the semiconductor slices in the support fixture. This may be accomplished either by dipping the support fixture and the semiconductor slices contained therein into a quantity of light sensitive material, or by spraying light sensitive material through the support fixture and onto the semiconductor slices. The support fixture is then rotated about the axis at a predetermined rate for a predetermined time in order to uniformly distribute a predetermined thickness of the light sensitive material over the entire surface areas of the semiconductor slices.

7 Claims, 5 Drawing Figures

APPARATUS FOR APPLYING A FILM OF MATERIAL TO SUBSTRATES OR SLICES

BACKGROUND AND SUMMARY OF THE INVENTION

This invention relates to apparatus for applying light sensitive materials to semiconductor slices, and more particularly to a method and apparatus for simultaneously coating a plurality of semiconductor slices with photoresist material.

In the manufacture of various electronic devices there is first formed a large diameter slice comprising a particular semiconductor material, for example, N-type semiconductor type material such as silicon. Various diffusion and/or deposition processes are then employed to form regions of a different type semiconductor material, in this case P-type semiconductor type material, on the semiconductor slice. In many instances conductive leads are formed on the slice and are electrically connected to various regions formed thereon. Finally, the slice is separated into a plurality of discrete components.

At various stages in the manufacturing process it is necessary to etch or otherwise treat certain regions of the slice while preventing treatment of adjacent regions. This is typically accomplished by coating the slice with a photoresist material, exposing the photoresist material to light through an appropriate mask, and then removing portions of the photoresist material to provide access to the underlying regions of the slice. This facilitates treatment of the selected regions of the slice in accordance with the desired treatment procedure, such as etching, while preventing treatment of the adjacent regions of the slice.

Notwithstanding the widespread use of photoresist materials in the manufacture of electronic devices, the processes which have been used heretofore to apply photoresist materials to semiconductor slices have not kept pace with other advances in the industry. Thus, it has often been the practice to apply photoresist materials to semiconductor slices on an individual slice basis. For example, in accordance with one prior art procedure, photoresist material is poured or sprayed onto one side of a semiconductor slice, after which the slice is spun to distribute the photoresist material uniformly across the surface of the slice. The other side of the slice must then be similarly treated.

The present invention comprises apparatus for applying light sensitive materials to semiconductor slices which overcomes the foregoing and other problems long since associated with the prior art. In accordance with the broader aspects of the invention, a plurality of semiconductor slices are mounted in a fixture. Photoresist or other light sensitive material is then applied simultaneously to all of the slices in the fixture. Thereafter the fixture is rotated to obtain a uniform coating of light sensitive material on each of the slices.

In accordance with more specific aspects of the invention, the slice supporting fixture comprises a housing formed from an open material such as screening, etc. so as to facilitate both the coating of the slices with the light sensitive material and the removal of the light sensitive material from the slices during the spinning operation. Within the fixture there is mounted structure adapted to support the slices by means of point contact with the edge portions of the slices. This is advantageous in assuring coverage of the entire surface areas of all of the slices with light sensitive material.

Two embodiments of the invention are disclosed. In one embodiment the slice supporting fixture comprises a pair of hingedly interconnected half cylinders each having a plurality of sawtooth-shaped slice supporting members mounted therein. Semiconductor slices are received in the fixture between the teeth of the sawtooth-shaped members. The second embodiment comprises a cup-shaped slice supporting fixture having triangular-shaped slice supporting members mounted in it. This embodiment of the invention is particularly useful in coating broken semiconductor slices.

Also disclosed are two techniques for applying light sensitive material to the semiconductor slices. One technique involves dipping the slice supporting fixture and the slices mounted therein into a quantity of light sensitive material. In the other technique light sensitive material is sprayed through the slice supporting fixture and onto the slices mounted therein.

DESCRIPTION OF THE DRAWINGS

A more complete understanding of the invention may be had by referring to the following Detailed Description when taken in conjunction with the accompanying Drawings, wherein.

DETAILED DESCRIPTION

Figures 1, 2, 3:
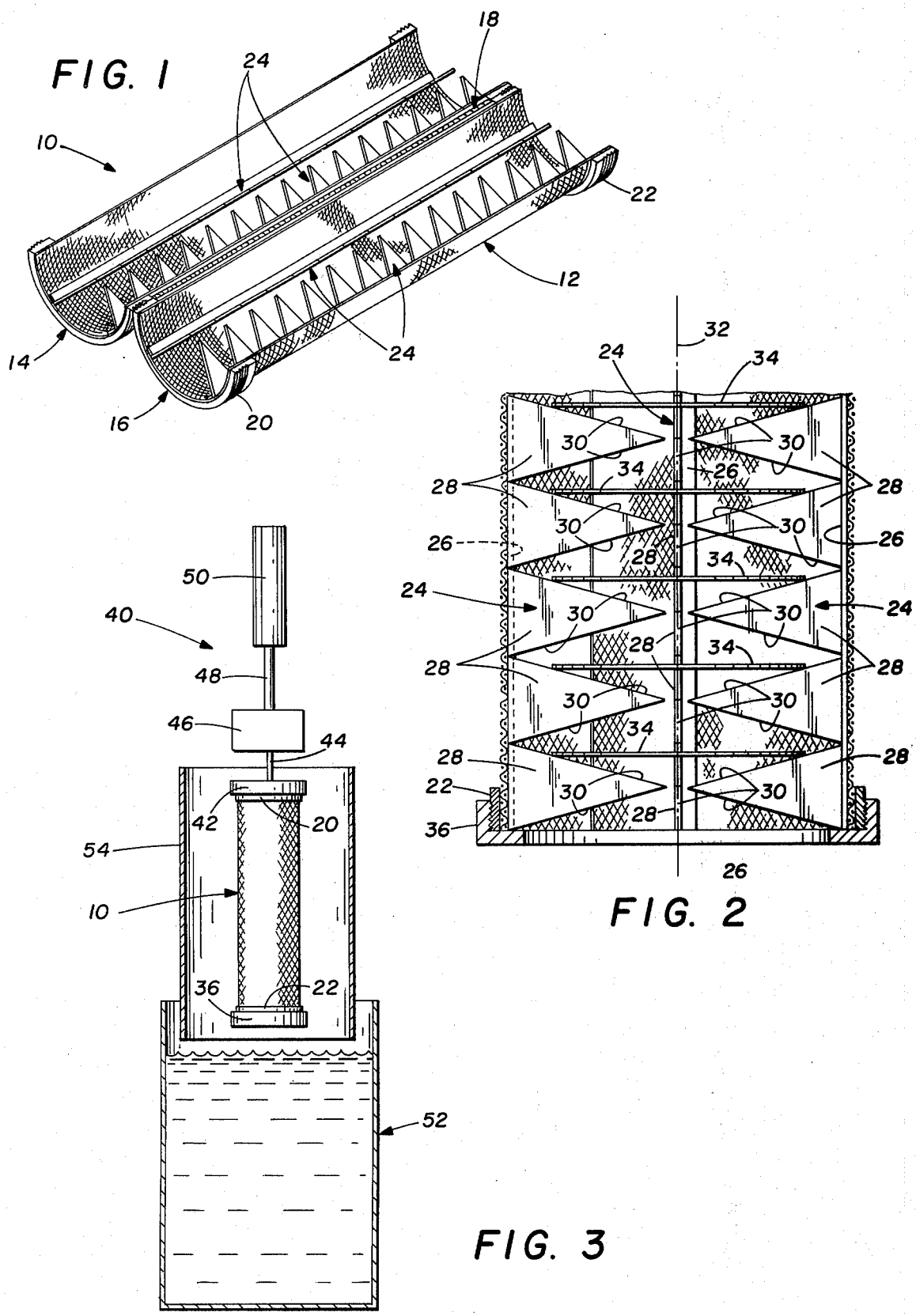
FIG. 1 is a perspective view of a semiconductor slice supporting fixture useful in the practice of the invention.
FIG. 2 is an enlarged sectional view of the fixture of FIG. 1 showing semiconductor slices supported therein.
FIG. 3 is an illustration of an apparatus for applying light sensitive materials to the semiconductor slices incorporating the invention.

Referring now to the Drawings, and particularly to FIG. 1 thereof, there is shown a semiconductor slice supporting fixture 10 useful in the practice of the invention. The fixture 10 comprises a cylinder 12 comprising an open structure adapted to facilitate fluid flow both into and out of the fixture 10. For example, the cylinder 12 may be formed from relatively large mesh metal screening material, perforated expanded metal material, metal material, etc. Various plastic materials may also be used in the construction of the fixture 10. The only requirement in this regard is that the structure of the cylinder 12 be such that light sensitive material is permitted to readily flow into and out of the fixture 10.

The cylinder 12 comprises a pair of half cylinders 14 and 16 which are interconnected along opposed edges by a hinge 18. Threaded collars 20 and 22 are mounted at opposite ends of the half cylinders 14 and 16. Thus, the cylinder 12 may be retained in the closed condition by means of end caps threadedly engaging the threaded collars 20 and 22.

As is best shown in FIG. 2, the slice supporting fixture 10 further comprises a plurality of slice supporting combs 24. Each comb 24 comprises a lip 26 which is secured to the inner wall of one of the half cylinders 14 or 16 and a plurality of teeth 28 projecting radially inwardly from the lip 26. Any desired number of combs 24 may be utilized in the fixture 10 in accordance with the requirements of a particular application of the invention. However, at least three combs 24 must be utilized in the fixture 10 in order to securely retain and position semiconductor slices therein.

The teeth 28 of the combs 24 comprise edges 30 each extending angularly both with respect to the central axis 32 of the cylinder 12 and with respect to the radius thereof. Moreover, the edges 30 of the teeth 28 comprise knife edges. By this means semiconductor slices 34 are engaged by the teeth 28 at their peripheries only, and by means of point contact. This is highly advantageous in assuring the application of light sensitive materials to substantially the entire area of each of the slices 34.

The slice supporting fixture 10 is utilized by first positioning the half cylinders 14 and 16 comprising the cylinder 12 in the opened condition illustrated in FIG. 1. A plurality of semiconductor slices are then mounted in the fixture 10. Each semiconductor slice is positioned between parallel sets of adjacent teeth 28 comprising the combs 24 of the fixture 10. The teeth 28 thus function to position the semiconductor slices in a spaced apart array extending along the central axis 32 of the fixture 10.

After the desired number of semiconductor slices has been positioned within the fixture 10, the half cylinders 14 and 16 are manipulated to close the cylinder 12. An end cap 36 is then threadedly engaged with the threaded collar 22 at one end of the cylinder. As is clearly shown in FIG. 2, the end cap 36 preferably comprises an open structure so as to facilitate fluid flow into and out of the fixture 10.

The end cap 36 functions to retain the cylinder 12 in the closed condition. This in turn retains the semiconductor slices 34 within the fixture 10 and in the spaced apart array extending along the axis 32 that is illustrated in FIG. 2. At any time thereafter the fixture 10 may be utilized in conjunction with appropriate apparatus such as that illustrated in FIGS. 3 and 4 to apply light sensitive material to each of the semiconductor slices 34 retained therein.

Referring to FIG. 3, there is shown an apparatus for applying light sensitive material to semiconductor slices 34 incorporating the invention. The threaded collar 20 of a semiconductor slice supporting fixture 10 of the type shown in FIGS. 1 and 2 is threadedly engaged with an end cap 42 connected to the output shaft 44 of a motor 46. The motor 46 is in turn supported on the piston rod 48 of a hydraulic cylinder 50.

In the use of the apparatus 40, the hydraulic cylinder 50 is initially actuated to lower the semiconductor slice supporting fixture 10 and the semiconductor slices contained therein into a tank of light sensitive material 52. Due to the open construction of the cylinder 12, this action causes the light sensitive material from the tank to flow into the fixture 10, thereby coating the entire surface area of both sides of each semiconductor slice contained in the fixture 10 with the light sensitive material. Following the coating operation, the hydraulic cylinder 50 is actuated to withdraw the fixture 10 and the slices contained therein from the tank 52, and to position the fixture within a shield 54. As soon as the fixture 10 is positioned within the shield 54, the motor 46 is actuated to rotate the fixture 10 about its central axis 32. Rotation of the fixture 10 effects removal of excess light sensitive material from the semiconductor slices contained therein under centrifugal action. Due to the open construction of the cylinder 12, the excess light sensitive material passes out of the fixture 10 and engages the shield 54, whereupon it is returned to the tank 52 under the action of gravity.

Rotation of the fixture 10 about its central axis also effects a uniform distribution of light sensitive material over the surface area of each semiconductor slice contained in the fixture. Moreover, the thickness of the light sensitive material which remains on each semiconductor slice depends on both the speed at which the fixture 10 is rotated and the time period of the rotation. In a typical application the fixture is rotated at a speed of between about 1,000 RPM and about 6,000 RPM and for a time period extending between about 3 seconds and about 60 seconds.

Figure 4:
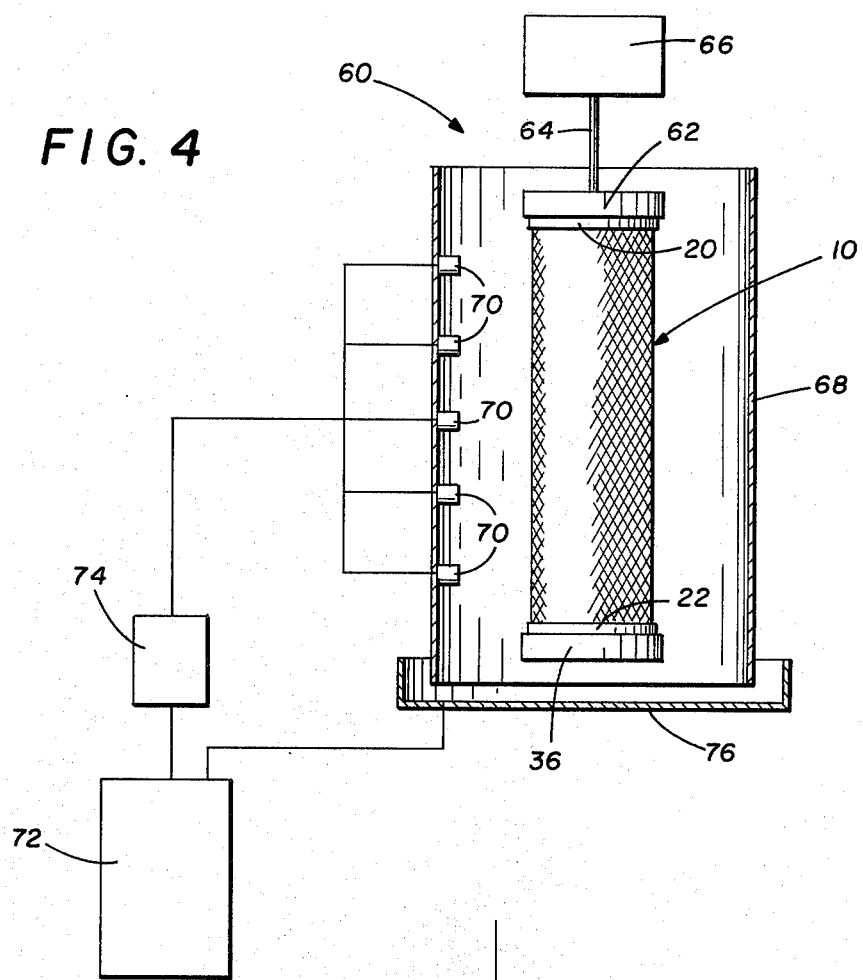
FIG. 4 is an illustration of an alternative apparatus for applying light sensitive materials to semiconductor slices incorporating the invention.

In FIG. 4 there is shown an alternative apparatus for applying light sensitive material to semiconductor slices 60 incorporating the invention. The apparatus 60 includes an end cap 62 which is threadedly engaged with the threaded collar 20 of a semiconductor slice supporting fixture 10 of the type shown in FIGS. 1 and 2. The fixture 10 has a plurality of semiconductor slices received therein, and has an end cap 36 threadedly engaged with the threaded collar 22.

The end cap 62 is secured to a drive shaft 64 of a motor 66. The motor 66 functions to rotate the fixture 10 within a shield 68. A plurality of sprayheads 70 are positioned within the shield 68 and are adapted to receive light sensitive material from a reservoir 72 under the action of a pump 74.

In the operation of the apparatus 60, the motor 66 is initially operated to rotate the fixture 10 and the pump 74 is simultaneously operated to discharge light sensitive material through the sprayheads 70. Due to the open construction of the cylinder 12 of the fixture 10, the light sensitive material passes into the fixture 10 and thoroughly coats the entire surface area of both sides of each semiconductor slice contained therein.

After the coating operation, the operation of the pump 74 is terminated. The motor 66 continues to rotate the fixture 10 in order to remove excess light sensitive material from the semiconductor slices by centrifugal action. Due to the open nature of the construction of the cylinder 12 of the fixture 10, the excess light sensitive material flows out of the fixture 10 and engages the shield 68. The light sensitive material then flows downwardly under the action of gravity into a pan 76 and is returned to the reservoir 72.

In addition to removing excess light sensitive material from the semiconductor material slices, rotation of the fixture 10 following the coating operation functions to distribute the light sensitive material uniformly over the entire surface area of both sides of each slice contained therein. The thickness of the light sensitive material which remains on the semiconductor slices is dependent upon both the speed of rotation of the fixture 10 and the duration of the rotation of the fixture 10 following the termination of the operation of the pump 74. These parameters are variable within wide limits in order to fulfill the requirements of particular applications, but the speed of rotation of the fixture 10 is typically between about 1,000 RPM and about 6,000 RPM, and the duration of rotation is typically between about 3 seconds and about 60 seconds.

At the conclusion of the operation of either the apparatus 40 or the apparatus 60, the semiconductor slice supporting fixture 10 is removed and opened. The coated semiconductor slices are then removed from the fixture, after which the light sensitive material coated thereon is dried and baked. At this point the manufacturing process involving the light sensitive material is continued in the usual fashion.

Figure 5:
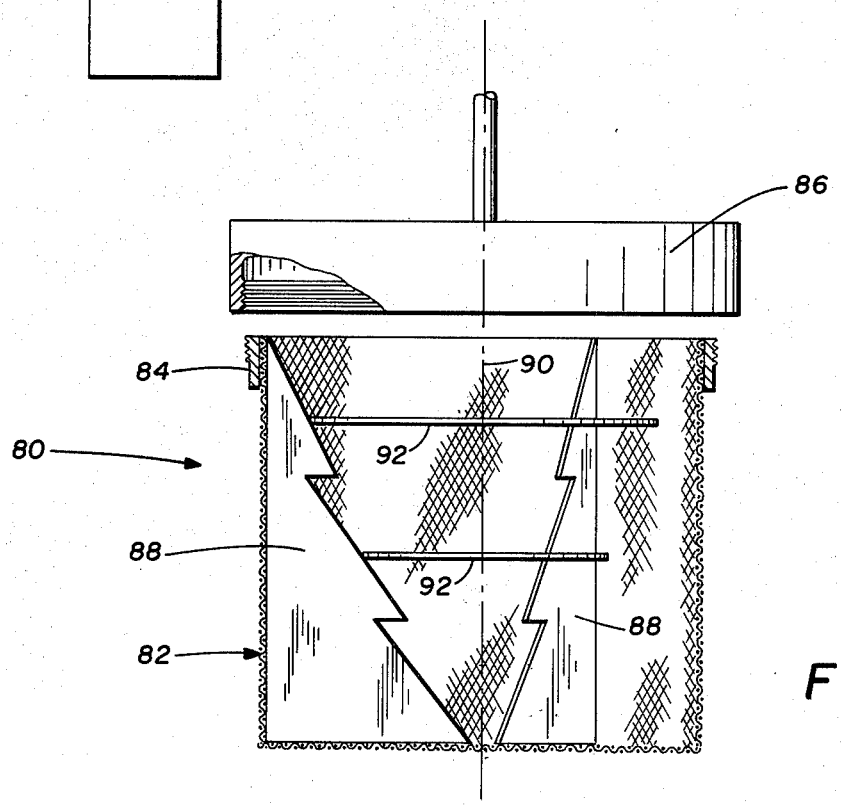
FIG. 5 is an exploded sectional view of an alternative slice supporting fixture useful in the practice of the invention.

Referring to FIG. 5, there is shown an alternative semiconductor slice receiving fixture 80 which is useful in the practice of the invention. The fixture 80 comprises a cup 82 having an open construction to facilitate fluid flow both into and out of the fixture 80. For example, the cup 82 may be formed from metal screening material, perforated metal material, expanded metal material, etc., or from various plastic materials. The only requirement in the selection of the material for the construction of the cup 82 is that sufficient open area be provided so as to facilitate the flow of light sensitive material into and out of the fixture 80.

A collar 84 is secured to the upper end of the cup 82. The collar 84 has an external thread whereby the fixture 80 may be threadedly engaged with an end cap 86. Such an end cap may comprise part of an apparatus for applying light sensitive materials to semiconductor slices, such as the apparatus 40 shown in FIG. 3 or the apparatus 60 shown in FIG. 4.

A plurality of triangularly shaped vanes 88 are mounted within the cup 82 of the fixture 80 and extend radially inwardly. Any number of vanes 88 may be utilized in the cup 82 depending on the requirements of the particular application. However, the cup 82 must contain at least three vanes 88 in order to securely receive and position semiconductor slices therein.

The sides of the vanes 88 extend angularly both with respect to the central axis 90 of the cup 82 and with respect to the radius thereof. Moreover, the edges of the vanes 88 comprise knife edges. By this means the vanes 88 are adapted to support semiconductor slices 92 by means of point contact with the peripheries of the semiconductor slices. This is advantageous in assuring uniform coverage of substantially the entire surface area of each semiconductor slice received in the cup 82.

In the use of the fixture 80, semiconductor slices 92 are mounted in the cup 82 in the manner shown. In this regard the construction of the fixture 80 is advantageous in that semiconductor slices of various sizes may be coated simultaneously. A particular advantage involves the fact that broken semiconductor slices may be coated with light sensitive material utilizing the fixture 80. After the semiconductor slices are mounted in the cup 82, the fixture 80 is mounted in an apparatus for applying light sensitive material to semiconductor slices such as the apparatus 40 shown in FIG. 3 or the apparatus 60 shown in FIG. 4, after which the apparatus is operated in the manner described hereinbefore.

Those skilled in the art will appreciate the fact that the present invention is useful in applying various light sensitive materials to semiconductor slices, particular photoresist materials. For example, the photoresist materials known as KMER and KPR may be applied by means of the invention, as well as metal resist materials made by Eastman Kodak. The particular type of light sensitive material used is not critical to the practice of the invention.

From the foregoing, it will be understood that the present invention comprises a method and apparatus for applying light sensitive material to semiconductor slices which incorporates numerous advantages over the prior art. Perhaps the primary advantage involves the fact that by means of the invention it is possible to apply light sensitive material to a plurality of semiconductor slices simultaneously. Another advantage involves the fact that by means of the invention both sides of each semiconductor slice are coated with light sensitive material simultaneously. Still another advantage involves the fact that by means of the invention it is possible to obtain a more uniform and even coating of light sensitive material on the semiconductor slices than is possible by means of prior art methods.

Although particular embodiments of the invention have been illustrated in the accompanying Drawings and described in the foregoing Detailed Description, it will be understood that the invention is not limited to the embodiments disclosed, but is capable of numerous rearrangements, modifications, and substitutions of parts and elements without departing from the spirit of the invention.

What is claimed is:

1. Apparatus for simultaneously applying light sensitive material to a plurality of semiconductor slices which comprises:
   a hollow, cylindrical supporting fixture formed from an open material;
   a plurality of slice supporting members mounted on and within the supporting fixture and extending radially inwardly with respect thereto, each of said slice supporting members comprising a plurality of knife edges each extending angularly with respect to the radius and with respect to the axis of the fixture for supporting a plurality of semiconductor slices by means of point contact;
   said plurality of slice supporting members defining a plurality of axially spaced sets each including at least three angularly extending knife edges;
   the knife edges of each set extending at substantially the same angle for supporting slices in a generally radial orientation;
   said semiconductor slices when supported by said knife edges being stacked in a spaced apart array extending along the axis of the fixture;
   means for simultaneously applying light sensitive material to the entire surface areas of all of the semiconductor slices supported by the knife edges within the fixture; and
   means for rotating the fixture about its axis at a predetermined rate and for a predetermined time so that a predetermined thickness of the light sensitive material is uniformly exposed over the entire surface area of each semiconductor slice.

2. The apparatus for simultaneously applying light sensitive material to a plurality of semiconductor slices according to claim 1 wherrein the supporting fixture comprises a pair of hingedly interconnected half cylinders and means for retaining the half cylinders in a closed relationship and thereby retaining the semiconductor slices within the fixture.

3. The apparatus for simultaneously applying light sensitive material to a plurality of semiconductor slices according to claim 2 wherein the slice supporting members within the fixture comprise a plurality of comb members each extending parallel to the axis of the fixture and radially inwardly with respect thereto.

4. The apparatus for simultaneously applying light sensitive material to a plurality of semiconductor slices according to claim 1 wherein wherein cylindrical structure comprises a cup-shaped structure and wherein the slice supporting members comprise at least three triangularly shaped vanes each extending parallel to the axis of the fixture and radially inwardly with respect thereto.

5. The apparatus for simultaneously applying light sensitive material to a plurality of semiconductor slices according to claim 1 wherein the cylindrical support fixture is formed from screening material.

6. The apparatus for simultaneously applying light sensitive material to a plurality of semiconductor slices according to claim 1 wherein the means for applying light sensitive material comprises means for dipping the fixture and the semiconductor slices contained therein into a quantity of light sensitive material.

7. The apparatus for simultaneously applying light sensitive material to a plurality of semiconductor slices according to claim 1 wherein the means for applying the light sensitive material comprises spraying means for directing light sensitive material through the cylindrical structure and onto the semiconductor slices contained therein.

* * * * *

UNITED STATES PATENT AND TRADEMARK OFFICE
CERTIFICATE OF CORRECTION

PATENT NO. : 3,974,797
DATED : August 17, 1976
INVENTOR(S) : Jearald L. Hutson

It is certified that error appears in the above-identified patent and that said Letters Patent are hereby corrected as shown below:

On Page 1, under References Cited, regarding Patent No. 2,614,316 to Dailey et al., 178/500 should be --118/500--;

Column 3, line 46, "34" should be --40--;

Column 6, line 53, "wherrein" should be --wherein--;

Column 6, line 66, the second instance of "wherein" should be deleted and the word "the" inserted.

Signed and Sealed this

Twenty-fourth Day of April 1979

[SEAL]

Attest:

RUTH C. MASON
Attesting Officer

DONALD W. BANNER
Commissioner of Patents and Trademarks